United States Patent
Gao et al.

(10) Patent No.: US 6,873,048 B2
(45) Date of Patent: Mar. 29, 2005

(54) SYSTEM AND METHOD FOR INTEGRATING MULTIPLE METAL GATES FOR CMOS APPLICATIONS

(75) Inventors: Wei Gao, Vancouver, WA (US); John F. Conley, Jr., Camas, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/376,795

(22) Filed: Feb. 27, 2003

(65) Prior Publication Data

US 2004/0171222 A1 Sep. 2, 2004

(51) Int. Cl.$^7$ .............................................. H01L 23/48
(52) U.S. Cl. ...................... 257/750; 257/764; 257/748; 257/736; 257/763; 257/741
(58) Field of Search ................................ 257/764, 750, 257/748, 736; 438/217, 223, 197, 199

(56) References Cited

U.S. PATENT DOCUMENTS

| | | | |
|---|---|---|---|
| 6,373,111 B1 * | 4/2002 | Zheng et al. ................ | 257/407 |
| 6,492,217 B1 * | 12/2002 | Bai et al. ..................... | 438/199 |
| 6,664,604 B1 * | 12/2003 | Besser et al. ................ | 257/412 |
| 6,727,130 B2 * | 4/2004 | Kim et al. ................... | 438/199 |

OTHER PUBLICATIONS

S.M. Sze, "Physics of Semiconductor Devices," John Wiley & Sons, New York (1981) p. 251.*

B.R. Rogers, "Underlayer Work Function Effect on Nucleation and Film Morphology of Chemical Vapor Deposdited Aluminium," Thin Solid Films, V. 408 (2002), pp. 87–96.*

* cited by examiner

Primary Examiner—Eddie Lee
Assistant Examiner—Thomas Magee
(74) Attorney, Agent, or Firm—David C. Ripma; Matthew D. Rabdau; Joseph P. Curtin

(57) ABSTRACT

A dual-gate MOSFET with metal gates and a method for setting threshold voltage in such a MOSFET is provided. The method comprises: forming a gate oxide layer overlying first and second channel regions; forming a first metal layer having a first thickness overlying the gate oxide layer; forming a second metal layer having a second thickness overlying the first metal layer first thickness; selectively removing the second metal layer overlying the first channel region; forming a third metal layer; establishing a first MOSFET with a gate work function responsive to the thicknesses of the first and third metal layer overlying the first channel region; and, establishing a second MOSFET, complementary to the first MOSFET, with a gate work function responsive to the combination of the thicknesses of the first, second, and third metal layers overlying the second channel region.

45 Claims, 4 Drawing Sheets

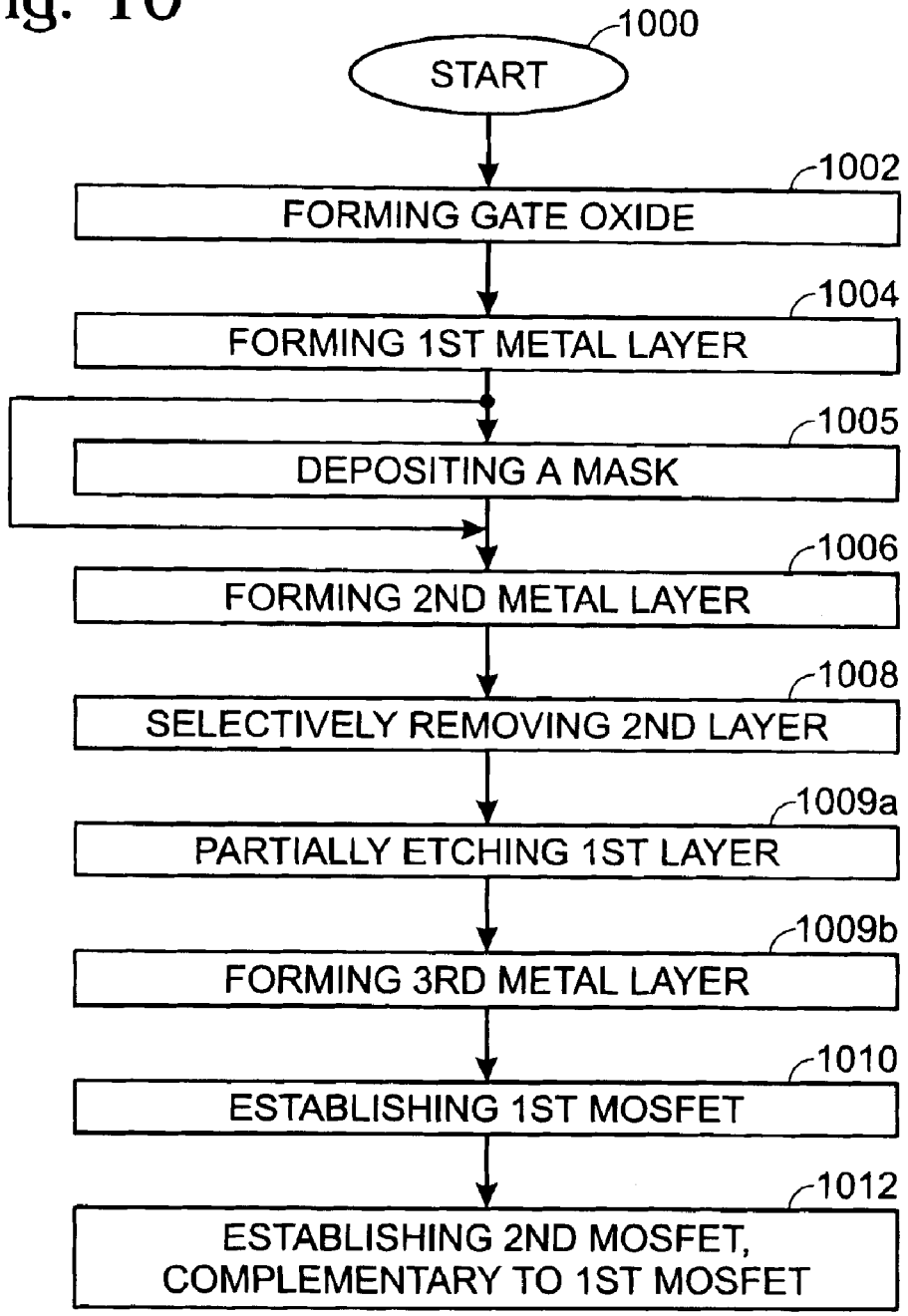

SYSTEM AND METHOD FOR INTEGRATING MULTIPLE METAL GATES FOR CMOS APPLICATIONS

RELATED APPLICATIONS

This application is a continuation-in-part of a pending patent application entitled, MOSFET THRESHOLD VOLTAGE TUNING WITH METAL GATE STACK CONTROL, invented by Gao et al., Ser. No. 10,345,744, filed Jan. 15, 2003.

BACKGROUND OF THE INVENTION

1. Field of the Invention

This invention generally relates to integrated circuit (IC) fabrication and, more particularly, to a system and method for setting threshold voltages using stacked metal gate structures.

2. Description of the Related Art

The threshold voltages (Vth) of the NMOS and PMOS components in a complementary metal oxide semiconductor (CMOS) circuit largely dictate the speed, standby current, and operating current performance characteristics. The Vth must be set to maximize the "on" current, while minimizing the "off" current. Usually this is a trade off that is determined by the circuit design and application. Typically, the Vth is adjusted through the fine-tuning of the doping level in the channel region of the transistors with a Vth adjust implant. As the feature size of transistors continues to scale down, the struggle to minimize short channel effects, and reduce punchthrough and drain-induced barrier lowering with implantations and anneals, ultimately limit the device speed.

As an alternative to adjusting Vth, the work function of the gate can be controlled. This is usually done with implants into the gate polysilicon, where donor type dopant is placed in the gate for NMOS, and acceptor dopants into PMOS gates. The use of doped polysilicon gates presents a different set of problems, however. Dopant diffusion, through the gate dielectric into the channel, affects the Vth and polysilicon depletion near the gate dielectric, and limits the performance of the transistors. This diffusion problem is addressed with the use of metal gate materials.

With metal gate technologies, the choice of an appropriate work function material is necessary for the N and P MOSFETs. Work function is the energy required to remove an electron from the Fermi level to vacuum. The work function of different materials, and even different metals, varies. Since the NMOS and PMOS work function requirements are different, the metal materials are typically different.

Conventional fabrication processes have employed the use of either channel implants combined with the choice of polysilicon or metal gate material. Thus, the work function of the gate has been dictated by the choice of the gate metal material. The fabrication of different gate work functions on the same wafer, such as is required for complementary NMOS and PMOS transistors, has required different gate materials. However, the use of completely different metal materials for use in the NMOS and PMOS gates results in additional fabrication steps and undesired complexity.

Conventionally, the first metal of a gate stack would be isotropically deposited. Then, a photolithographic process would be used to etched away the metal from undesired areas. After that, a second metal can be deposited to complete CMOS gate metal deposition. The underlying gate dielectric potentially faces exposure to an etchant when the undesired first metal areas are removed and is, thus, more susceptible to being thinned, contaminated, and/or damaged.

It would be advantageous if a metal gate stack could be formed without etching the first (bottom) metal in the stack, to minimize damage to the underlying gate dielectric.

SUMMARY OF THE INVENTION

This present invention eliminates contamination or damage to the underlying gate dielectric when forming a dual-layer metal gate structure. The gate dielectric is protected by a first metal from subsequent deposition and etching processes. That is, the present invention avoids any processing directly on the gate dielectric. After depositing the first metal layer, the gate dielectric is never exposed again, as subsequent processes are performed on surfaces overlying the first metal. In addition to protecting the gate dielectric, the first metal layer is used to create the desired device threshold voltage.

Accordingly, a method is provided for setting threshold voltage in a dual-gate MOSFET with metal gates. The method comprises: forming a gate oxide layer overlying first and second channel regions; forming a first metal layer having a first thickness overlying the gate oxide layer; forming a second metal layer having a second thickness overlying the first metal layer first thickness; selectively removing the second metal layer overlying the first channel region; establishing a first MOSFET with a gate work function responsive to the thickness of the first metal layer overlying the first channel region; and, establishing a second MOSFET, complementary to the first MOSFET, with a gate work function responsive to the combination of the thicknesses of the first and second metal layers overlying the second channel region.

Establishing a first MOSFET with a gate work function responsive to the first metal thickness overlying the first channel region includes establishing a gate work function in response to the first metal first thickness. Likewise, the second MOSFET gate work function is responsive to the first metal first thickness and the second metal second thickness.

In some aspects of the method following the selective removal of the second metal layer overlying the first channel region, the method comprises: partially etching the first metal layer, leaving a first metal layer with a third thickness, less than the first thickness, overlying the first channel region. Then, the first MOSFET gate work function is responsive to the first metal third thickness. In some aspects following the partial etching of the first metal layer overlying the first channel region, the method comprises forming a third metal layer having a fourth thickness overlying the first and second channel regions. Then, the first MOSFET gate work function is responsive to the thicknesses of the first and third metal layers, and the second MOSFET gate work function is responsive to the thicknesses of the first, second, and third metal layers.

Additional details of the above-described method and a dual-gate MOSFET with metal gate stack are provided below.

BRIEF DESCRIPTION OF THE DRAWINGS

FIG. 10 is a flowchart illustrating the present invention method for setting threshold voltage in a dual-gate MOSFET with metal gates.

DETAILED DESCRIPTION OF THE PREFERRED EMBODIMENTS

Figure 1:
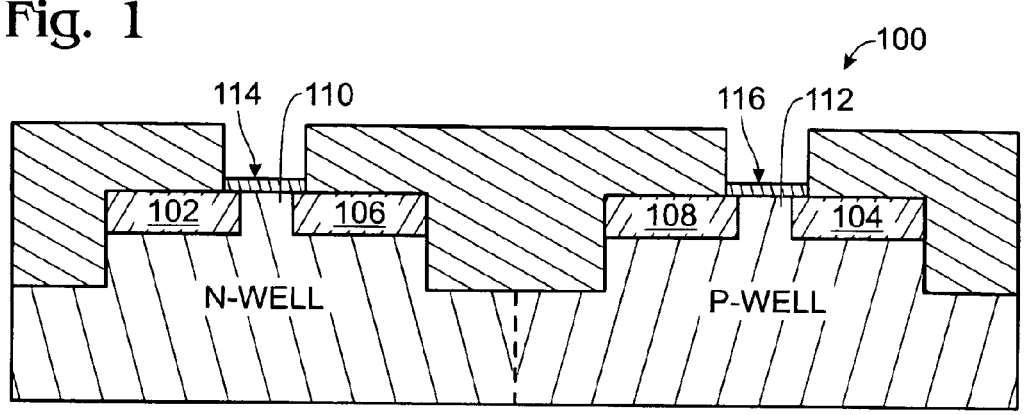
FIGS. 1 through 8 are partial cross-sectional views of steps in the completion of the present invention dual-gate MOSFET with metal gate stack.

FIGS. 1 through 8 are partial cross-sectional views of steps in the completion of the present invention dual-gate MOSFET with metal gate stack. FIG. 1 depicts the dual-gate MOSFET 100 prior to the deposition of the gate metal layers. The underlying sources 102 and 104, drains 106 and 108, channels 110 and 112, and gate dielectric layers 114 and 116 may be formed by any conventional process.

Figure 2:
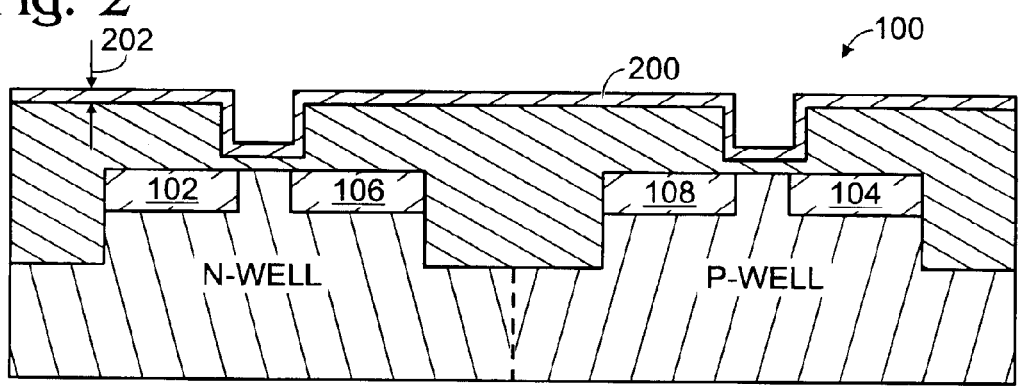

FIG. 2 depicts the dual-gate MOSFET 100 of FIG. 1 after the deposition of a first metal layer 200. The first metal layer 200 can be deposited to a desired first thickness 202, typically less than 200 Å, using any conventional process. Depending on the desired gate work functions, the composition of the first thin film 200 can be an elemental metal such as W, Ti, or Ta, binary materials such as Ta—N or Ti—N, or compounds consisting of more than two elements.

Figure 3:
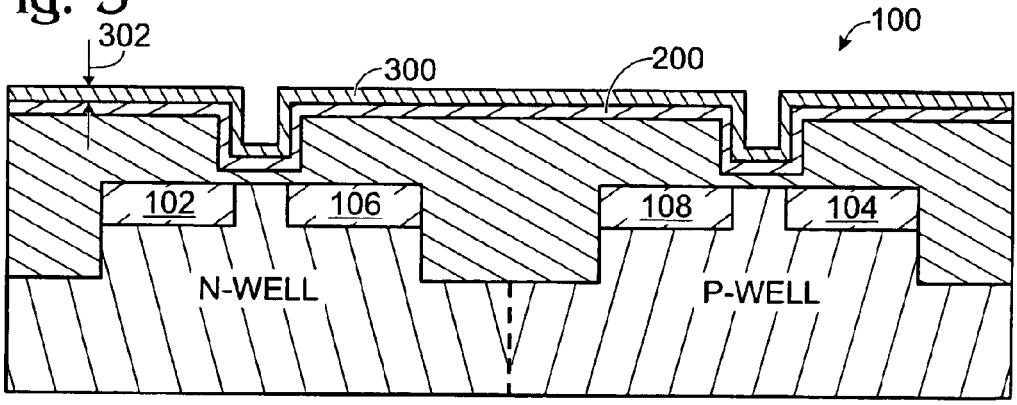

FIG. 3 depicts the dual-gate MOSFET 100 of FIG. 2 following the deposition of a second metal layer 300. The second metal layer is deposited to a desired second thickness 302, for example 500 Å, by any conventional process. Depending on the desired gate work functions, the composition of the second thin film 300 can be an elemental metal such as Al, Pt, or Cu, binaries such as W—N or Ti—N, or compounds with more than two elements.

Figure 4:
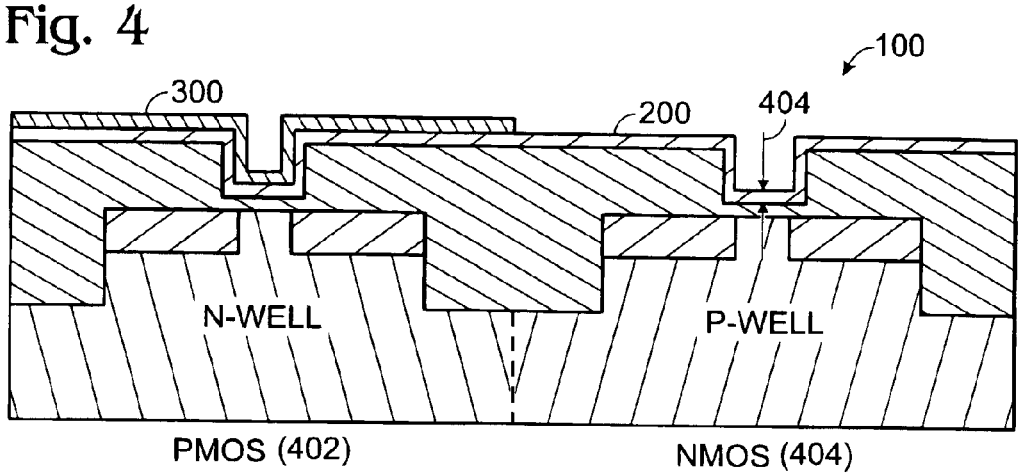

FIG. 4 depicts the dual-gate MOSFET of FIG. 3 following the etching of the second metal layer 300. The second metal layer 300 can be selectively etched off of either one of the transistors (either the NMOS 400 or PMOS 402 transistor) by a conventional photolithographic process and an etching method that is highly selective to the second metal 300, while not substantially effecting the first metal 200. Note, as shown, the second metal 300 has been etched from the NMOS transistor 400. Some etching of the first metal is tolerable, forming a first metal third thickness 404, as one of the purposes of the first metal layer is to protect the underlying gate dielectric. Note that in some aspects, the first metal is not etched and retains its initial first thickness. If the first metal thickness (either the first thickness or the third thickness 404) is thin enough, the first metal 200 does not affect the Vth of the metal gate.

Figure 5:
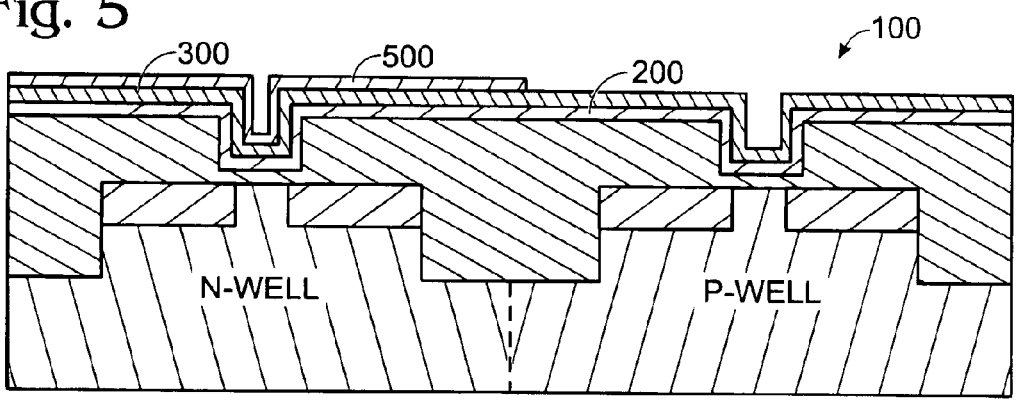

FIG. 5 depicts the dual-gate MOSFET 100 of FIG. 4 following the deposition of a third metal layer 500. Typically, the exposed first and second metal 200/300 surfaces are cleaned before the deposition of third metal layer 500. The third metal layer 500 can be isotropically deposited over the whole wafer, and the device 100 can be completed by a conventional chemical-mechanical polishing (CMP) or a patterned dry etch processes.

Figure 6:
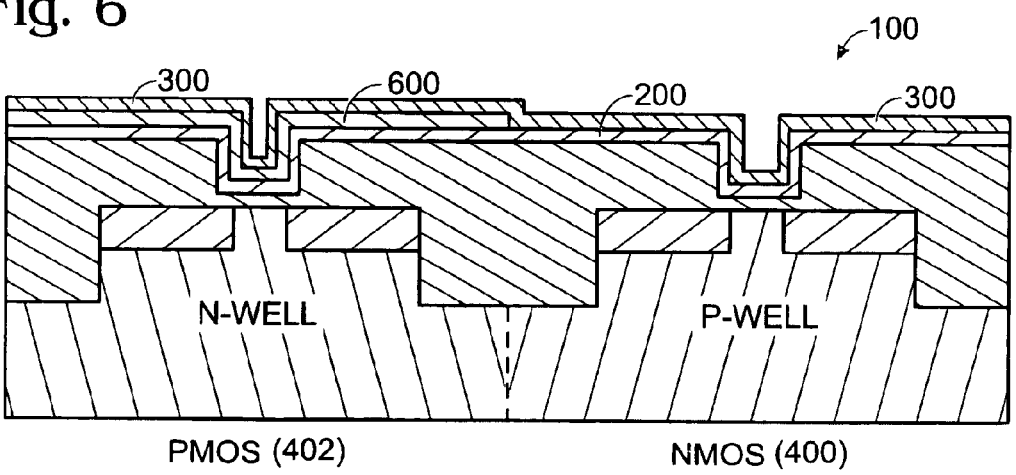

FIG. 6 depicts the dual-gate MOSFET 100 of FIG. 2 following an alternate gate formation scheme. In this approach, the thickness of the first metal 200 is altered for the purpose of adjusting work function. A photo-resist or a hard mask 600 is deposited by any conventional method on either one of the transistors. For example as shown, the mask 600 is formed on the PMOS area 402 after the first metal layer 200 is deposited. After forming mask 600, the second metal layer 300, of either the same or a different kind of material, is deposited.

Figure 7:
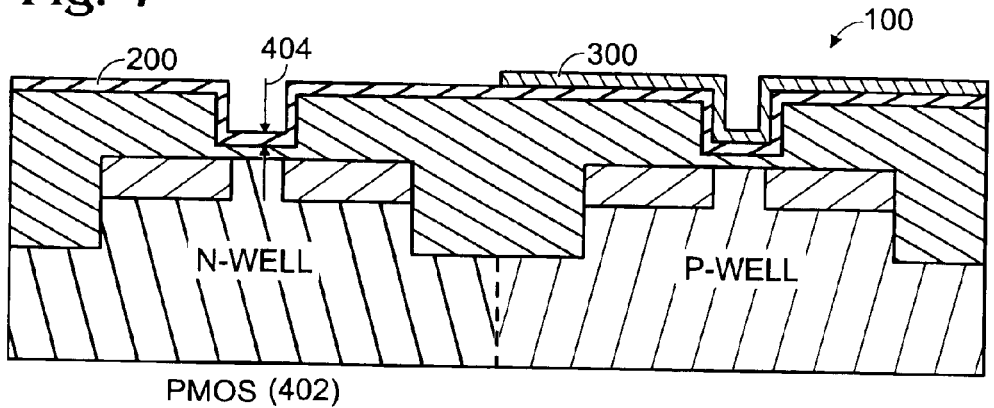

FIG. 7 depicts the dual-gate MOSFET 100 of FIG. 6 following the etching of the second metal layer. The second metal layer, together with photo-resist or hard mask, can be removed by any conventional method (e.g. lift off) so that a first metal third thickness 404 overlying the PMOS transistor 402 (in this example) can be formed to adjust threshold voltage. In some aspects not shown, the first metal overlying the PMOS area is not etched, so that it retains its initially deposited first thickness.

Figure 8:
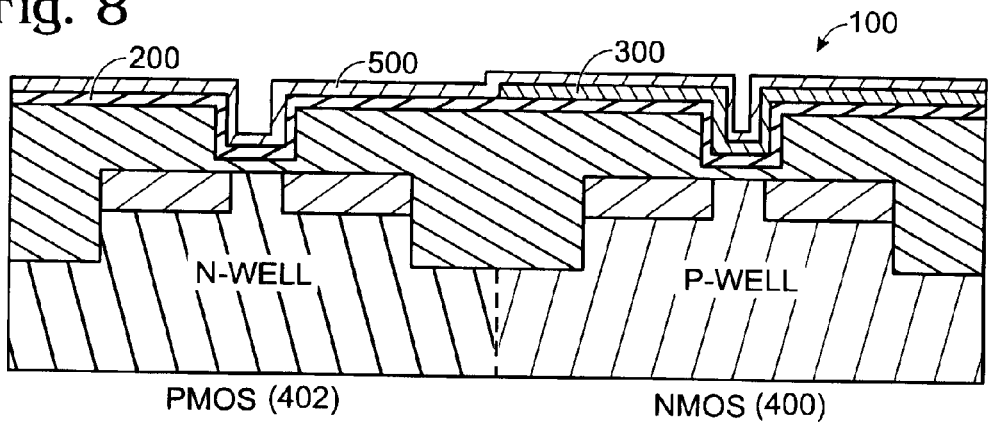

FIG. 8 depicts the dual-gate MOSFET 100 of FIG. 7 following the deposition of the third metal layer 500. The third metal layer 500 can be deposited, after cleaning the underlying surfaces if necessary, so that different threshold voltages for NMOS 400 and PMOS 402 transistors could be achieved. The device 100 can then be completed by CMP or a patterned dry etch of the metal stack.

Figure 9:
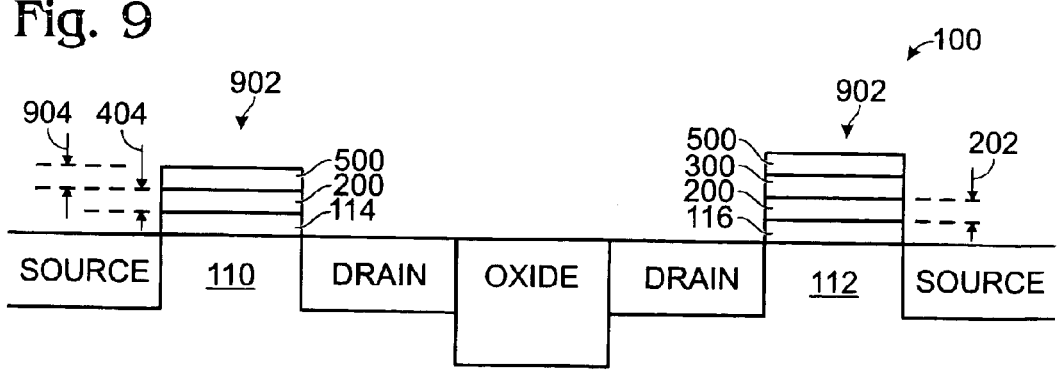
FIG. 9 is a partial cross-sectional view of the dual-gate MOSFET of either FIG. 8 or FIG. 5 upon completion of the gate fabrication process.

FIG. 9 is a partial cross-sectional view of the dual-gate MOSFET of either FIG. 8 or FIG. 5 upon completion of the gate fabrication process. Note that the following discussion has been generalized to describe complementary channels regions, as opposed to specific depictions of either NMOS or PMOS regions. Gate oxide layers 114/116 overlie complementary first and second channel regions 110/112, respectively. The complementary channel regions 110/112 are associated with complementary NMOS and PMOS transistors. A first metal layer 200 overlies the gate oxide layers 114/116. A second metal layer 300 overlies the first metal layer 200 in the second channel region 112. As used herein, the phrase "in the channel region" means overlying the channel region. In some, but not all aspects of the MOSFET 100, the first 200 and second 300 metal layers are made from a common (first) material. In other aspects, the second 300 and third 500 metals layers are made from a common material.

A third metal layer 500 overlies the first metal layer 200 in the first channel region 110 and the second metal layer 300 in the second channel region 112. In some aspects, a first gate 900 overlies the first channel region 110 with a work function responsive to the thicknesses of the first 200 and third 500 metal layers. In other aspects, a second gate 902 overlies the second channel region 112 with a work function responsive to the combination of the thicknesses of the first 200, second 300, and third 500 metal layers. Typically, the third metal layer fourth thickness 904 is in the range of 100 to 1000 Å.

As noted above, in earlier parts of the fabrication process the second metal layer temporarily overlies the first channel region 110. Thus, the MOSFET 100 could be described as having a temporary second metal layer overlying the first channel region 110. With respect to FIGS. 6 through 8, a temporary mask (see reference designator 600 of FIG. 6) can be interposed between the first metal layer 200 and the temporary second metal layer in the first channel region 110.

As noted above, in some aspects the first metal layer 200 has a first thickness 202 in the second channel region and a third thickness 404, less than the first thickness 202, in the first channel region 100. In other aspects, the first metal layer 200 has the first thickness 202 in both the first 110 and second 112 channel regions (not shown). Typically, the first metal layer first thickness 202 is less than 200 Å.

In some aspects of the MOSFET, the first metal layer third thickness 404 is less than 15 Å and the third metal layer 500 has a fourth thickness 904 greater than 100 Å. Then, the first gate 900 work function is substantially responsive to the fourth thickness 904 of the third metal layer 500. As used herein, the term "substantially" means that it is the fourth thickness 904 that primarily defines the work function, and that this work function is either not affected by the other metals in the stack, or affected very slightly.

In other aspects, the first metal layer 200 has a low work function and the third metal layer 500 has a high work function. For example, the first metal layer 200 can be an elementary metal, such as W. Ti, or Ta, or a binary metals such as Ta—N or Ti—N. Again, as noted above, the material may be composed or more than two elements. To continue the example, the third metal layer 500 can be an elemental metal such as Ir, Pt, or Cu, or a binary metal such as W—N or Ti—N.

Alternately, the first metal layer 200 may have a high work function and the third metal layer 500 may have a low work function. Then, the first metal 200 could be an elemental metal such as Ir, Pt, or Cu, or a binary metal such as W—N or Ti—N. The third metal 500 could be an elementary metal such as W, Ti, or Ta, or a binary metals such as Ta—N or Ti—N.

In some aspects of the MOSFET 100, the first metal third thickness 404 is less than 15 Å. Then, the first gate 900 work function is substantially responsive to the thickness of the third metal layer 500. Alternately, if the first metal layer third thickness 404 is greater than approximately 100 Å, the first gate 900 work function is substantially responsive to the third thickness 404 of the first metal layer 200.

In other aspects, the first metal layer 200 has a low work function and the second metal layer 300 has a high work function. The first layer 200 may be any of the above-mentioned low work function materials, while the second metal layer 300 may be any of the above-mentioned high work function materials. Alternately, the first metal layer 200 has a high work function and the second metal layer 300 has a low work function. The first layer 200 may be any of the above-mentioned high work function materials, while the second metal layer 300 may be any of the above-mentioned low work function materials.

In some aspects of the invention, both the first and second metal layers 200/300 have a low work functions and the third metal layer 500 has a high work function. The first and second metals 200/300 can either be the same, or different metals. Alternately, the first and second metal layers 200/300 have a high work functions and the third metal layer 500 has a low work function. Again, the first and second metals 200/300 can either be the same, or different metals.

FIG. 10 is a flowchart illustrating the present invention method for setting threshold voltage in a dual-gate MOSFET with metal gates. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1000.

Step 1002 forms a gate oxide layer overlying first and second channel regions. Step 1004 forms a first metal layer having a first thickness overlying the gate oxide layer. Generally, the first metal layer has a first thickness of less than 200 Å. Step 1006 forms a second metal layer having a second thickness overlying the first metal layer first thickness. Generally, the second thickness is in the range of 100 to 1000 Å. Step 1008 selectively removes the second metal layer overlying the first channel region. Step 1010 establishes a first MOSFET with a gate work function responsive to the thickness of the first metal layer overlying the first channel region. Step 1012 establishes a second MOSFET, complementary to the first MOSFET, with a gate work function responsive to the combination of the thicknesses of the first and second metal layers overlying the second channel region.

In some aspects of the method, establishing a first MOSFET with a gate work function responsive to the first metal thickness overlying the first channel region in Step 1010 includes establishing a gate work function in response to the first metal first thickness. Establishing a second MOSFET, complementary to the first MOSFET, with a gate work function responsive to the combination of the thicknesses of the first and second metal layers overlying the second channel region in Step 1012 includes establishing a gate work function in response to the first metal first thickness and the second metal second thickness.

In some aspects of the method, a further step, Step 1009a, following the selective removal of the second metal layer overlying the first channel region (Step 1008), partially etches the first metal layer, leaving a first metal layer with a third thickness, less than the first thickness, overlying the first channel region. Then, establishing a first MOSFET with a gate work function in Step 1010 includes establishing a gate work function in response to the first metal third thickness.

In other aspects following the partial etching of the first metal layer overlying the first channel region in Step 1009a, Step 1009b forms a third metal layer having a fourth thickness overlying the first and second channel regions. Generally, the fourth thickness is in the range of 100 to 1000 Å. Then, establishing a first MOSFET with a gate work function responsive to the thickness of the first metal layer overlying the first channel region in Step 1010 includes establishing a gate work function in response to the thicknesses of the first and third metal layers. Likewise, establishing a second MOSFET, complementary to the first MOSFET, with a gate work function responsive to the combination of the thicknesses of the first and second metal layers overlying the second channel region in Step 1012 includes establishing a gate work function in response to the thicknesses of the first, second, and third metal layers.

In some aspects of the method, partially etching the first metal layer, leaving a first metal layer with a third thickness in Step 1009a includes the third thickness being less than 15 Å. Forming a third metal layer having a fourth thickness overlying the first and second channel regions in Step 1009b may include the fourth thickness being greater than 100 Å. Then, establishing a gate work function in response to the thicknesses of the first and third metal layers overlying the first channel region in Step 1010 includes establishing a gate work function substantially in response to the thickness of the third metal layer.

In some aspects of the method, Step 1009b is performed without the necessity of performing Step 1009a. That is, the first metal layer has the first thickness overlying both gates. For example, the gate work function established in Step 1010 would be responsive to the combination of the first metal first thickness and the third metal fourth thickness.

In some aspects, forming a first metal layer in Step 1004 includes the first metal layer having a low work function and forming a third metal layer in Step 1009b includes the third metal having a high work function. In other aspects, Step 1006 includes the second metal layer having a low work function. For example, the first metal (and second) layer with the low work function may be an elementary metal such as W, Ti, or Ta, or a binary metals such as Ta—N or Ti—N. The third metal layer with the high work function may be an elemental metal such as Ir, Pt, or Cu, or a binary metal such as W—N or Ti—N.

Alternately, forming a first metal layer in Step 1004 may include the first metal having a high work function and forming a third metal layer in Step 1009b may include the third metal having a low work function. In some aspects, Step 1006 includes the second metal layer having a high work function. Then, the first (and second) metal could be one of the high work materials mentioned above and the third metal could be one of the low work materials mentioned above.

In some aspects, forming a first metal layer having a first thickness overlying the gate oxide layer in Step 1004 includes the first thickness being less than approximately 15 Å. Then, establishing a gate work function in response to the thicknesses of the first and third metal layers overlying the first channel region in Step 1010 includes establishing a gate work function substantially in response to the thickness of the third metal layer.

Alternately, forming a first metal layer in Step 1004 may include the first thickness being greater than approximately 100 Å. Then, establishing a gate work function in response to the thicknesses of the first and third metal layers overlying the first channel region in Step 1010 would include establishing a gate work function substantially in response to the thickness of the first metal layer.

In other aspects of the method prior to the deposition of the second metal layer (Step 1006), Step 1005 selectively deposits a mask (either a hard mask or photoresist) overlying the second channel region. Then, selectively removing of the second metal layer overlying the first channel region in Step 1008 includes protecting the first metal layer overlying the second channel region with the mask. In some aspects, forming a first metal layer (Step 1004) and forming a second metal layer (Step 1006) include forming both first and second layers from a common (first) metal material.

In some aspects, Step 1004 forms a first metal layer having a low work function, using one of the above-mentioned low work function materials, and Step 1006 forms a second metal layer having a high work function, using one of the above-mentioned high work function materials. Alternately, Step 1004 forms a first metal layer having a high work function, using one of the above-mentioned high work function materials, and Step 1006 forms a second metal layer having a low work function, using one of the above-mentioned low work function materials.

In some aspects, Step 1004 forms a first metal layer having a first thickness of approximately 15 Å. All the above-mentioned thickness are approximate in the sense that they are dependent upon convention deposition and etching tolerances. Then, establishing a gate work function in response to the thicknesses of the first and second metal layers overlying the second channel region in Step 1012 includes establishing a gate work function substantially in response to the thickness of the second metal layer.

Alternately, Step 1004 forms a first metal layer having a first thickness of greater than approximately 100 Å. Then, establishing a gate work function in response to the thicknesses of the first and second metal layers overlying the second channel region in Step 1012 includes establishing a gate work function substantially in response to the thickness of the first metal layer.

A dual-gate MOSFET with metal gate stacks and a method for setting the threshold voltage of the same have been provided. Examples of specific NMOS and PMOS gate stacks have been given to illustrate the device, however, it should be understood that any of the gate formation processes could be used to fabricate either an NMOS or PMOS transistor. Likewise, some conventional gate materials have been provided as examples, but the present invention is not limited to any particular materials. Other variations and embodiments of the invention will occur to those skilled in the art.

We claim:

1. In a dual-gate MOSFET with metal gates, a method for setting threshold voltage, the method comprising:
   forming a gate oxide layer overlying first and second channel regions;
   forming a first metal layer having a first thickness overlying the gate oxide layer;
   forming a second metal layer having a second thickness overlying the first metal layer first thickness;
   selectively removing the second metal layer overlying the first channel region;
   forming a third metal layer having a fourth thickness overlying the first and second channel regions;
   establishing a first MOSFET with a gate work function responsive to the thicknesses of the first and third metal layers overlying the first channel region; and,
   establishing a second MOSFET, complementary to the first MOSFET, with a gate work function responsive to the combination of the thicknesses of the first, second, and third metal layers overlying the second channel region.

2. The method of claim 1 further comprising:
   following the selective removal of the second metal layer overlying the first channel region, partially etching the first metal layer, leaving a first metal layer with a third thickness, less than the first thickness, overlying the first channel region.

3. The method of claim 2 wherein partially etching the first metal layer, leaving a first metal layer with a third thickness includes the third thickness being less than 15 Å;
   wherein forming a third metal layer having a fourth thickness overlying the first and second channel regions includes the fourth thickness being greater than 100 Å; and,
   wherein establishing a gate work function in response to the thicknesses of the first and third metal layers overlying the first channel region includes establishing a gate work function substantially in response to the thickness of the third metal layer.

4. The method of claim 1 wherein forming a first metal layer includes the first metal layer having a low work function; and,
   wherein forming a third metal layer includes the third metal having a high work function.

5. The method of claim 4 wherein forming a second metal layer includes the second metal layer having a low work function.

6. The method of claim 4 wherein forming a first metal layer having a low work function includes the first metal being a material selected from the group including elementary metals such as W, Ti, Ta, and binary metals such as Ta—N and Ti—N; and,
   wherein forming a third metal layer having a high work function includes the third metal being a material selected from the group of elemental metals such as Ir, Pt, Cu, and binary metal such as W—N and Ti—N.

7. The method of claim 1 wherein forming a first metal layer includes the first metal having a high work function; and,
   wherein forming a third metal layer includes the third metal having a low work function.

8. The method of claim 7 wherein forming a second metal layer includes the second metal layer having a high work function.

9. The method of claim 8 wherein forming a first metal layer having a high work function includes the first metal being a material selected from the group of elemental metals such as Ir, Pt, Cu, and binary metal such as W—N and Ti—N; and, wherein forming a third metal layer having a low work function includes the third metal being a material selected from the group including elementary metals such as W, Ti, Ta, and binary metals such as Ta—N and Ti—N.

10. The method of claim 1 wherein forming a first metal layer having a first thickness overlying the gate oxide layer includes the first thickness being less than approximately 15 Å; and, wherein establishing a gate work function in response to the thicknesses of the first and third metal layers overlying the first channel region includes establishing a gate work function substantially in response to the thickness of the third metal layer.

11. The method of claim 1 wherein forming a first metal layer having a first thickness overlying the gate oxide layer includes the first thickness being greater than approximately 100 Å; and, wherein establishing a gate work function in response to the thicknesses of the first and third metal layers overlying the first channel region includes establishing a gate work function substantially in response to the thickness of the first metal layer.

12. The method of claim 1 wherein forming a third metal layer having a fourth thickness includes the third metal layer fourth thickness being in the range of 100 to 1000 Å.

13. The method of claim 1 further comprising:

prior to the deposition of the second metal layer, selectively depositing a mask overlying the second channel region; and, wherein selectively removing of the second metal layer overlying the first channel region includes protecting the first metal layer overlying the second channel region with the mask.

14. The method of claim 13 wherein forming a first metal layer overlying the gate oxide layer includes forming the first metal layer from a first metal material; and, wherein forming a second metal layer overlying the first metal layer includes forming the second metal layer from the first metal material.

15. The method of claim 1 wherein forming a first metal layer includes the first metal layer having a low work function; and, wherein forming a second metal layer overlying the first metal layer includes the second metal having a high work function.

16. The method of claim 15 wherein forming a first metal layer having a low work function includes the first metal being a material selected from the group including elementary metals such as W, Ti, Ta, and binary metals such as Ta—N and Ti—N; and, wherein forming a second metal layer having a high work function includes the second metal being a material selected from the group of elemental metals such as Ir, Pt, Cu, and binary metal such as W—N and Ti—N.

17. The method of claim 1 wherein forming a first metal layer includes the first metal having a high work function; and, wherein forming a second metal layer overlying the first metal layer includes the second metal having a low work function.

18. The method of claim 17 wherein forming a first metal layer having a high work function includes the first metal being a material selected from the group of elemental metals such as Ir, Pt, Cu, and binary metal such as W—N and Ti—N; and, wherein forming a second metal layer having a low work function includes the second metal being a material selected from the group including elementary metals such as W, Ti, Ta, and binary metals such as Ta—N and Ti—N.

19. The method of claim 1 wherein forming a first metal layer having a first thickness overlying the gate oxide layer includes the first thickness being less than 200 Å.

20. The method of claim 19 wherein forming a first metal layer having a first thickness overlying the gate oxide layer includes the first thickness being approximately 15 Å; and, wherein establishing a gate work function in response to the thicknesses of the first and second metal layers overlying the second channel region includes establishing a gate work function substantially in response to the thickness of the second metal layer.

21. The method of claim 19 wherein forming a first metal layer having a first thickness overlying the gate oxide layer includes the first thickness being greater than approximately 100 Å; and, wherein establishing a gate work function in response to the thicknesses of the first and second metal layers overlying the second channel region includes establishing a gate work function substantially in response to the thickness of the first metal layer.

22. The method of claim 1 wherein forming a second metal layer having a second thickness overlying the first metal layer first thickness includes the second thickness being in the range of 100 to 1000 Å.

23. A dual-gate MOSFET with metal gate stack comprising:

a gate oxide layer overlying complementary first and second channel regions;

a first metal layer having a first thickness overlying the second channel region gate oxide layer and a third thickness, less than the first thickness, overlying the first channel region gate oxide layer;

a second metal layer overlying the first metal layer in the second channel region;

a third metal layer overlying the first metal layer in the first channel region and the second metal layer in the second channel region;

a first gate overlying the first channel region with a work function responsive to the thicknesses of the first and third metal layers; and, a second gate overlying the second channel region with a work function responsive to the combination of the thicknesses of the first, second, and third metal layers.

24. The MOSFET of claim 23 wherein the first metal layer third thickness is less than 15 Å;

wherein the third metal layer has a fourth thickness greater than 100 Å; and, wherein the first gate work function is substantially in response to the fourth thickness of the third metal layer.

25. The MOSFET of claim 23 wherein the first and second metal layer are made from a first material.

26. The MOSFET of claim 23 wherein the first metal layer has a low work function; and, wherein the third metal layer has a high work function.

27. The MOSFET of claim 26 wherein the second metal layer has a low work function.

28. The MOSFET of claim 26 wherein the first metal layer is a material selected from the group including elementary metals such as W, Ti, Ta, and binary metals such as Ta—N and Ti—N; and, wherein the third metal layer is a material selected from the group of elemental metals such as Ir, Pt, Cu, and binary metal such as W—N and Ti—N.

29. The MOSFET of claim 23 wherein the first metal layer has a high work function; and, wherein the third metal layer has a low work function.

30. The MOSFET of claim 29 wherein the second metal layer has a high work function.

31. The MOSFET of claim 30 wherein the first metal is a material selected from the group of elemental metals such as Ir, Pt, Cu, and binary metal such as W—N and Ti—N; and, wherein the third metal is a material selected from the group including elementary metals such as W, Ti, Ta, and binary metals such as Ta—N and Ti—N.

32. The MOSFET of claim 23 wherein the first metal layer has a first thickness less than 200 Å.

33. The MOSFET of claim 23 wherein the first metal third thickness is less than 15 Å; and, wherein the first gate work function is substantially responsive to the thickness of the third metal layer.

34. The MOSFET of claim 23 wherein the first metal layer third thickness is greater than approximately 100 Å; and, wherein the first gate work function is substantially responsive to the third thickness of the first metal layer.

35. The MOSFET of claim 23 wherein the third metal layer fourth thickness is in the range of 100 to 1000 Å.

36. The MOSFET of claim 23 further comprising:

a temporary mask interposed between tho first metal layer and the temporary second metal layer in the first channel region.

37. The MOSFET of claim 23 wherein the first metal layer has a low work function; and, wherein the second metal layer has a high work function.

38. The MOSFET of claim 37 wherein the first metal layer is a material selected from the group including elementary metals such as W, Ti, Ta, and binary metals such as Ta—N and Ti—N; and, wherein the second metal layer is a material selected from the group of elemental metals such as Ir, Pt, Cu, and binary metal such as W—N and Ti—N.

39. The MOSFET of claim 23 wherein the first metal layer has a high work function; and, wherein the second metal layer has a low work function.

40. The MOSFET of claim 39 wherein the first metal is a material selected from the group of elemental metals such as Ir, Pt, Cu, and binary metal such as W—N and Ti—N; and, wherein the second metal is a material selected from the group including elementary metals such as W, Ti, Ta, and binary metals such as Ta—N and Ti—N.

41. A dual-gate MOSFET with metal gate stack comprising:

a gate oxide layer overlying complementary first and second channel regions;

a first metal layer overlying the gate oxide layer, having a first thickness less than 200 Å;

a second metal layer overlying the first metal layer in the second channel region;

a third metal layer overlying the first metal layer in the first channel region and the second metal layer in the second channel region;

a first gate overlying the first channel region with a work function responsive to the thicknesses of the first and third metal layers; and, a second gate overlying the second channel region with a work function responsive to the combination of the thicknesses of the first, second, and third metal layers.

42. A dual-gate MOSFET with metal gate stack comprising:

a gate oxide layer overlying complementary first and second channel regions;

a first metal layer overlying the gate oxide layer;

a temporary mask interposed between the first metal layer and a temporary second metal layer in the first channel region;

a second metal layer overlying the first metal layer in the second channel region;

a third metal layer overlying the first metal layer in the first channel region and the second metal layer in the second channel region;

a first gate overlying the first channel region with a work function responsive to the thicknesses of the first and third metal layers; and, a second gate overlying the second channel region with a work function responsive to the combination of the thicknesses of the first, second, and third metal layers.

43. A dual-gate MOSFET with metal gate stack comprising:

a gate oxide layer overlying complementary first and second channel regions;

a first metal layer overlying the gate oxide layer having a low work function;

a second metal layer overlying the first metal layer in the second channel region, having a high work function;

a third metal layer overlying the first metal layer in the first channel region and the second metal layer in the second channel region;

a first gate overlying the first channel region with a work function responsive to the thicknesses of the first and third metal layers; and, a second gate overlying the second channel region with a work function responsive to the combination of the thicknesses of the first, second, and third metal layers.

44. A dual-gate MOSFET with metal gate stack comprising.

a gate oxide layer overlying complementary first and second channel regions;

a first metal layer overlying the gate oxide layer, having a high work function;

a second metal layer overlying the first metal layer in the second channel region, having a low work function;

a third metal layer overlying the first metal layer in the first channel region and the second metal layer in the second channel region;

a first gate overlying the first channel region with a work function responsive to the thicknesses of the first and third metal layers; and, a second gate overlying the second channel region with a work function responsive to the combination of the thicknesses of the first, second, and third metal layers.

45. A dual-gate MOSFET with metal gate stack comprising:

a gate oxide layer overlying complementary first and second channel regions;

a first metal layer overlying the gate oxide layer, made from a first material;

a second metal layer overlying the first metal layer in the second channel region, made from the first material;

a third metal layer overlying the first metal layer in the first channel region and the second metal layer in the second channel region;

a first gate overlying the first channel region with a work function responsive to the thicknesses of the first and third metal layers; and, a second gate overlying the second channel region with a work function responsive to the combination of the thicknesses of the first, second, and third metal layers.

* * * * *